United States Patent
Xue et al.

(10) Patent No.: US 8,184,409 B2
(45) Date of Patent: *May 22, 2012

(54) MAGNETORESISTIVE DEVICE WITH ENHANCED PINNED LAYER

(75) Inventors: Song Sheng Xue, Edina, MN (US); Paul Edward Anderson, Eden Prairie, MN (US); Konstantin Rudolfovich Nikolaev, Edina, MN (US); Patrick Joseph Ryan, St. Paul, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/898,147

(22) Filed: Oct. 5, 2010

(65) Prior Publication Data
US 2011/0019314 A1    Jan. 27, 2011

Related U.S. Application Data

(63) Continuation of application No. 11/222,624, filed on Sep. 9, 2005, now Pat. No. 7,835,116.

(51) Int. Cl.
*G11B 5/39* (2006.01)
*G11B 5/127* (2006.01)

(52) U.S. Cl. ......... 360/324.11; 360/327.24; 360/327.33; 365/158

(58) Field of Classification Search ............. 360/327.24, 360/327.33, 324.11; 365/157, 158
See application file for complete search history.

(56) References Cited

U.S. PATENT DOCUMENTS

| | | |
|---|---|---|
| 4,356,523 A | 10/1982 | Yeh |
| 4,860,138 A | 8/1989 | Vinal et al. |
| 5,159,511 A | 10/1992 | Das |
| 5,216,560 A | 6/1993 | Brug et al. |
| 5,301,079 A | 4/1994 | Cain et al. |
| 5,508,866 A | 4/1996 | Gill et al. |
| 5,557,491 A | 9/1996 | Gill et al. |
| 5,627,703 A | 5/1997 | Smith |
| 5,825,595 A | 10/1998 | Gill |
| 5,867,350 A | 2/1999 | Haga et al. |
| 6,122,151 A | 9/2000 | Saito et al. |
| 6,249,406 B1 | 6/2001 | Gill et al. |
| 6,556,388 B1 | 4/2003 | Everitt et al. |
| 6,661,627 B1 | 12/2003 | Kadokawa |
| 6,762,915 B2 | 7/2004 | Pokhil et al. |
| 6,765,819 B1 * | 7/2004 | Bhattacharyya et al. ..... 365/158 |
| 7,190,559 B2 | 3/2007 | Kagami et al. |
| 7,366,009 B2 * | 4/2008 | Katti ............................. 365/158 |
| 2004/0061986 A1 | 4/2004 | Kagami et al. |
| 2006/0291106 A1 | 12/2006 | Shoji |

FOREIGN PATENT DOCUMENTS

| | | |
|---|---|---|
| JP | 10091920 A | 4/1998 |
| JP | 10190090 A | 7/1998 |
| JP | 11175925 A | 7/1999 |

* cited by examiner

*Primary Examiner* — Brian Miller
(74) *Attorney, Agent, or Firm* — HolzerIPLaw, PC

(57) ABSTRACT

A magnetoresistive device includes a free layer, a separating layer, a pinned layer, and a magnetic stabilizer in close proximity to the pinned layer, wherein the magnetic stabilizer may enhance the stability of the magnetization direction of the pinned layer.

20 Claims, 3 Drawing Sheets

MAGNETORESISTIVE DEVICE WITH ENHANCED PINNED LAYER

CROSS-REFERENCE TO RELATED APPLICATION

This application is a continuation of U.S. application Ser. No. 11/222,624, filed Sep. 9, 2005.

BACKGROUND

The present invention relates generally to a magnetoresistive stack for use in applications such as a magnetic read head, magnetic sensor or magnetic random access memory. In particular, the present invention relates to a magnetoresistive stack having enhanced magnetization and stability of its pinned layer.

Magnetoresistive devices, such as giant magnetoresistive (GMR) devices, are used in magnetic data storage systems to detect magnetically encoded information stored on a magnetic data storage medium such as a magnetic disc. A time dependent magnetic field from a magnetic medium directly modulates the resistivity of the GMR device. A change in resistance of the GMR device can be detected by passing a current through the GMR device and measuring the voltage across the GMR device. The resulting signal can be used to recover the encoded information from the magnetic medium.

A typical GMR device configuration is the GMR spin valve, in which the GMR device is made of a non-magnetic spacer layer positioned between a ferromagnetic pinned layer and a ferromagnetic free layer. The magnetization of the pinned layer is fixed in a predetermined direction, while the magnetization of the free layer rotates freely in response to an external magnetic field. The resistance of the GMR device varies as a function of an angle formed between the magnetization direction of the free layer and the magnetization direction of the pinned layer. This multi-layered spin valve configuration allows for a more pronounced magnetoresistive effect, i.e. greater sensitivity and higher total change in resistance, than is possible with anisotropic magnetoresistive (AMR) devices, which generally consist of a single ferromagnetic layer.

GMR spin valves are configured to operate either in a current-in-plane (CIP) mode or a current-perpendicular-to-plane (CPP) mode. In CIP mode, the sense current is passed through the device in a direction parallel to the layers of the device. In the CPP mode, a sense current is passed through the device in a direction perpendicular to the layers of the device.

A tunneling magnetoresistive (TMR) device is similar in structure to a GMR spin valve configured in CPP mode, but the physics of the device are different. For a TMR device, rather than using a spacer layer, a barrier layer is positioned between the free layer and the pinned layer. Electrons must tunnel through the barrier layer. A sense current flowing perpendicular to the plane of the layers of the TMR device experiences a resistance that is proportional to the cosine of an angle formed between the magnetization direction of the free layer and the magnetization of the pinned layer.

As the need continues for higher areal density for recording heads, higher density memory elements and smaller magnetic sensors, the size of magnetoresistive devices continues to decrease. However, as the size of magnetoresistive devices decreases, the variation in magnetization direction of the pinned layer increases. For example, a 350 nanometer (nm) sensor has a standard deviation of its pinning angle of about 2.5 degrees. However, for a sensor of about 50 nm in size, the standard deviation of its pinning angle increases to about 13 degrees.

One solution to this problem is to increase the size of the pinned layer in relation to the free layer. For example, U.S. Pat. No. 6,762,915 discloses a read sensor for a magnetic read head with a free layer, a pinned layer, and a pinning layer, wherein the pinned and pinning layers each have a greater lateral size than the free layer and a greater perpendicular size than the free layer.

However, there remains a need for enhanced stability of the magnetization direction of the pinned layer in magnetoresistive stacks. Therefore, it is desirable to develop magnetoresistive stacks with increased stability of the magnetic orientation of the pinned layer.

SUMMARY

The present invention provides a magnetoresistive device having a free layer, a spacing layer, a pinned layer, and a magnetic stabilizer. The magnetic stabilizer increases the stability of the magnetization direction of the pinned layer.

DETAILED DESCRIPTION

Figure 1A:
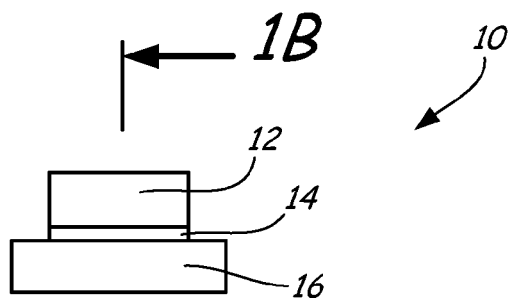
FIG. 1A is a layer diagram of a magnetoresistive stack of the present invention.

FIG. 1A shows magnetoresistive stack 10, which includes free layer 12, separating layer 14 and pinned layer 16. Pinned layer 16 is somewhat wider than free layer 12.

Figure 1B:
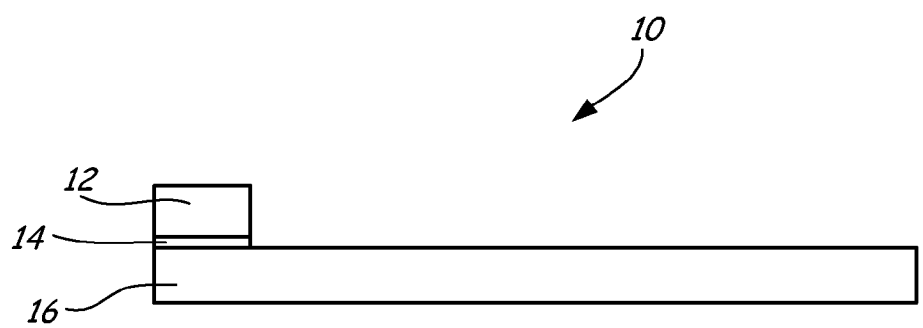
FIG. 1B is a cross-sectional layer diagram of the magnetoresistive stack of the present invention viewed along 1B-1B of FIG. 1.

FIG. 1B shows magnetoresistive stack 10 as viewed from a cross section along 1B-1B of FIG. 1. FIG. 1B shows that pinned layer 16 is substantially longer than free layer 12 and separating layer 14.

Figure 1C:
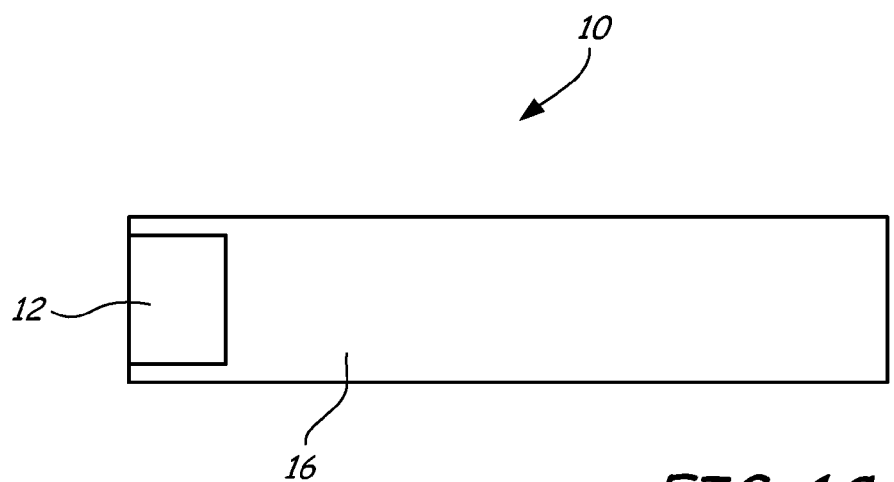
FIG. 1C is a top view of the magnetoresistive stack.

FIG. 1C shows a top view of magnetoresistive stack 10. The view has been rotated 90 degrees from both of FIGS. 1A and 1B. Separating layer 14 is not visible in this view. FIG. 1C shows that pinned layer 16 is somewhat wider and substantially longer than free layer 12.

Pinned layer 16 is made of a ferromagnetic layer or a synthetic ferromagnetic layer. A ferromagnetic layer is typically made of a ferromagnetic alloy, such as CoFe, NiFe or NiFeCo. Pinned layer 16 may also consist of the combination of a pinned layer and a pinning layer, such as a ferromagnetic pinned layer with an antiferromagnetic pinning layer, or a synthetic ferromagnetic pinned layer with an antiferromagnetic pinning layer. An antiferromagnetic layer is typically made of PtMn, IrMn, NiMn, or FeMn. Synthetic antiferromagnetic layers are made of two ferromagnetic layers separated by a layer of Ru about 9 angstroms (Å) thick.

Free layer 12 is typically made of a ferromagnetic alloy such as CoFe, NiFe or NiFeCo. Free layer 12 and pinned layer 16 are selected to have different responses to magnetic fields, so that the relative orientation of their magnetic moments can be varied by application of an external magnetic field. Free layer 12 is free to change its magnetic orientation in the presence of an external magnetic field, while pinned layer 16 has a fixed magnetic orientation that does not change significantly in the presence of an external magnetic field.

Separating layer 14, which separates the fixed and free magnetic layers, may be a spacer layer (in the case of a spin valve device) or a tunneling barrier layer (in the case of a tunneling magnetoresistive device). A spacer layer is a non-magnetic conductor, such as copper, that separates the fixed and free magnetic layers. A tunneling barrier layer is an insulating layer, such as aluminum oxide, that is sufficiently thin that electrons are able to quantum-mechanically tunnel through it.

Electrical resistance through magnetoresistive stack 10 depends on the relative magnetic orientation of free layer 12 and pinned layer 16. Resistance to the current is a maximum when the magnetic orientations of the two layers are anti-parallel, while resistance is a minimum when the magnetic orientations of the two layers are parallel. Thus, if free layer 12 and pinned layer 16 have the same magnetic orientation, current will be able to flow through magnetoresistive stack 10. If free layer 12 and pinned layer 16 have different magnetic orientations, essentially no current will be able to flow through magnetoresistive stack 10.

As magnetoresistive stacks become smaller to accommodate the needs of high density magnetic recording, variation in magnetization directions increases. Pinned layer 16 has much stronger shape anisotropy in the cross-sectional direction than in other directions. As best shown in FIG. 1B, pinned layer 16 is substantially longer than free layer 12 and spacer layer 14 in the cross-sectional direction. In a typical embodiment of the invention, free layer 12 is less than or equal to about 100 nm in length and pinned layer 16 is at least twice as long as free layer 12. Free layer 12 is less than or equal to about 50 nm in the ABS direction, and pinned layer 16 is at least 1.2 times as wide as free layer 12. As a result, pinned layer 16 of magnetoresistive stack 10 has reduced variation in its pinning angle, which results in a more efficient device for use in high density recording.

Magnetoresistive stack 10 is made using methods that are known in the art. The structure typically begins as three layers that are similar in size. Part of free layer 12 and separating layer 14 are removed using techniques such as ion milling or reactive oxidation. Sufficient material is removed from free layer 12 and separating layer 14 so that pinned layer 16 is somewhat wider and substantially longer than free layer 12 and separating layer 14.

Figure 2:
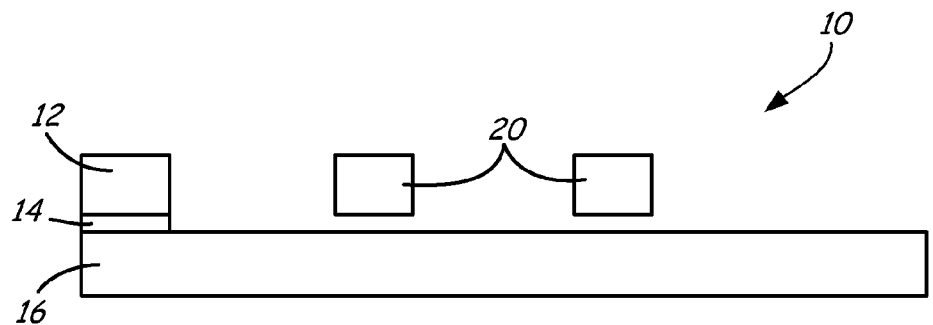
FIG. 2 is a layer diagram of a first embodiment of a magnetoresistive stack of the present invention.

FIG. 2 shows a cross-sectional view of magnetoresistive stack 10, including free layer 12, separating layer 14 and pinned layer 16. Pinned layer 16 is somewhat wider and substantially longer than free layer 12 and separating layer 14. In this embodiment of the invention, conductors 20 are placed in close proximity to the pinned layer. Conductors 20 are proximate to the surface of pinned layer 16 that is adjacent to separating layer 14. Conductors 20 are made of conducting materials such as copper, aluminum or gold. Conductors 20 are typically about 1 micron (μm) in diameter and spaced about 1 μm from pinned layer 16. This embodiment of the invention takes advantage of the reduced size of free layer 12 to allow conductors 20 to be placed in close proximity to the surface of pinned layer 16 that is closest to free layer 12.

During operation, a fixed direct current flows through conductors 20. As a result of the current flow, a magnetic field is induced around conductors 20 and in close proximity to pinned layer 16. The direction of current flow through conductors 20 is selected so that the induced magnetic field around conductors 20 has the same magnetic orientation as pinned layer 16. The magnetic field created by the current flowing through conductors 20 enhances the stability of the magnetization direction of pinned layer 16 by providing an external bias to pinned layer 16, so that its magnetic orientation remains fixed in the desired direction.

Figure 3:
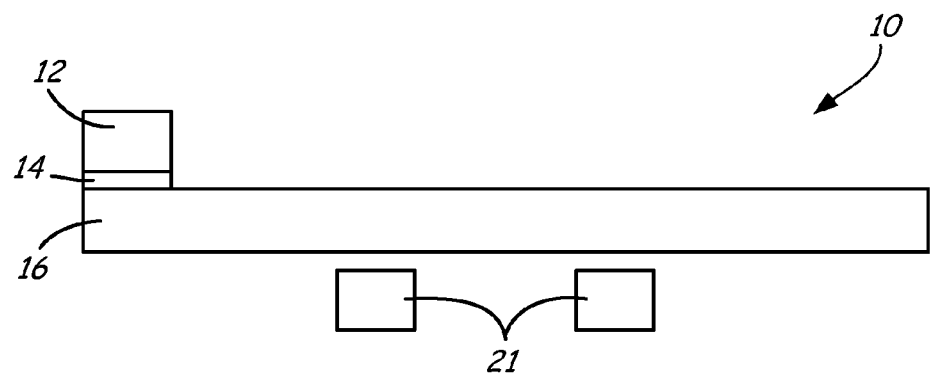
FIG. 3 is a layer diagram of a second embodiment of a magnetoresistive stack of the present invention.

FIG. 3 shows another embodiment of magnetoresistive stack 10, which again includes free layer 12, separating layer 14 and pinned layer 16. In this embodiment of the invention, conductors 21 are placed in close proximity to the surface of pinned layer 16 that is furthest from free layer 12. During operation, a fixed direct current flows through conductors 21. As a result of the current flow, a magnetic field is induced around conductors 21 and in close proximity to pinned layer 16. Like conductors 20, conductors 21 are made of conducting materials such as copper, aluminum or gold, and conductors 21 are typically about 1 μm in diameter and spaced about 1 μm from pinned layer 16.

The direction of current flow through conductors 21 is selected so that the induced magnetic field has the same magnetic orientation as pinned layer 16. The magnetic field created by the current flowing through conductors 21 enhances the stability of the magnetization direction of pinned layer 16 by providing an external bias to pinned layer 16, so that its magnetic orientation remains fixed in the desired direction.

Figure 4:
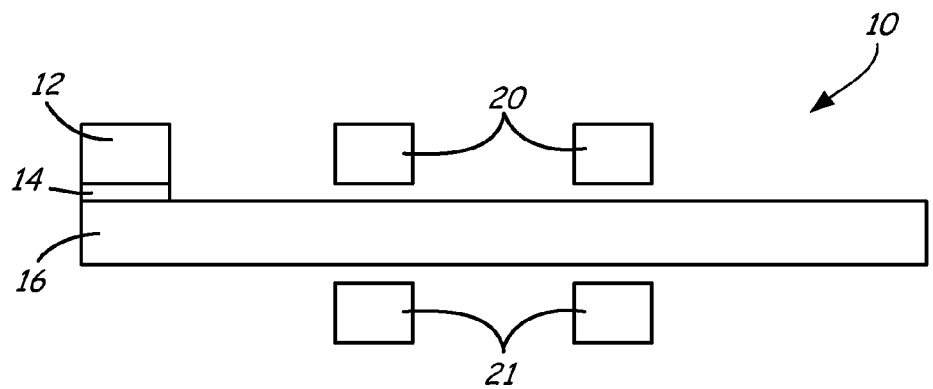
FIG. 4 is a layer diagram of a third embodiment of a magnetoresistive stack of the present invention.

FIG. 4 shows another embodiment of magnetoresistive stack 10, which again includes free layer 12, separating layer 14 and pinned layer 16. In this embodiment of the invention, conductors 20 are placed in close proximity to the surface of pinned layer 16 that is closest to free layer 12 and conductors 21 are placed in close proximity to the surface of pinned layer 16 that is furthest from free layer 12.

During operation, a fixed direct current flows through conductors 20 and a fixed direct current flows through conductors 21. The direction of current flow through conductors 20 is selected so that the induced magnetic field has the same magnetic orientation as pinned layer 16, and the direction of current flow through conductors 21 is selected so that the induced magnetic field has the same magnetic orientation as pinned layer 16. It will be appreciated by those skilled in the art that the electrical currents will flow in opposite directions in conductors 20 and 21, so that the induced fields will be in the same direction. As a result of the current flow, a magnetic field is induced around conductors 20 and conductors 21 and in close proximity to pinned layer 16. The magnetic field created by the currents flowing through conductors 20 and conductors 21 enhances the stability of the magnetization direction of pinned layer 16 by providing an external bias to pinned layer 16, so that its magnetic orientation remains fixed in the desired direction.

Figure 5:
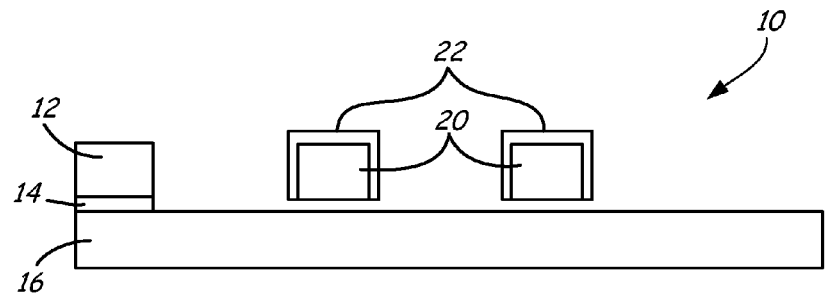
FIG. 5 is a layer diagram of a fourth embodiment of a magnetoresistive stack of the present invention.

FIG. 5 shows another embodiment of magnetoresistive stack 10, which again includes free layer 12, separating layer 14 and pinned layer 16. Conductors 20 are placed in close placed in close proximity to the surface of pinned layer 16 that is closest to free layer 12. In this embodiment of the invention, soft magnetic cladding layer 22 has been added around part of the circumference of conductors 20. Soft magnetic cladding layer 22 is typically about 1 μm thick and made of a soft magnetic alloy, such as NiFe or CoNiFe.

During operation, a fixed direct current flows through conductors 20. As a result of the current flow, a magnetic field is induced around conductors 20 and in close proximity to pinned layer 16. The direction of current flow through conductors 20 is selected so that the induced magnetic field has the same magnetic orientation as pinned layer 16. Soft magnetic cladding layer 22 shields the cladded portion of conductors 20, so that the induced magnetic field is directed toward pinned layer 16. The magnetic field created by the current flowing through conductors 20 enhances the stability of the magnetization direction of pinned layer 16 by providing an external bias to pinned layer 16, so that its magnetic orientation remains fixed in the desired direction. Soft magnetic cladding 22 may be added to conductors 20 and conductors 21 in any of the embodiments shown in FIGS. 2-4.

Figure 6:
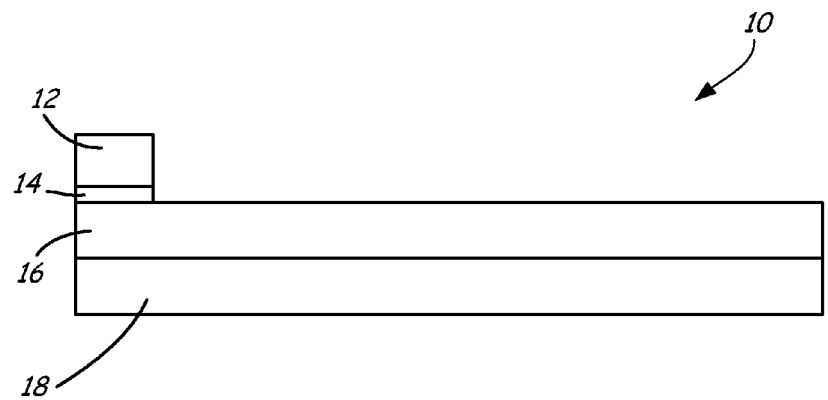
FIG. 6 is a layer diagram of a fifth embodiment of a magnetoresistive stack of the present invention.

FIG. 6 shows another embodiment of magnetoresistive stack 10, which includes free layer 12, separating layer 14 and pinned layer 16. In this embodiment of the invention, hard magnetic layer 18 has been added. Hard magnetic layer 18 is typically about 10 nm thick and made of a hard magnetic alloy, such as CoPt or CoCrPt. Hard magnetic layer 18 is adjacent to the surface of pinned layer 16 on the side of pinned layer 16 that is furthest from free layer 12. Hard magnetic layer 18 magnetically couples with pinned layer 16, so that the magnetic orientation of pinned layer 16 remains in the desired direction. Hard magnetic layer 18 has the same magnetic orientation as pinned layer 16 and provides added stabilization of the magnetization direction of pinned layer 16.

Figure 7:
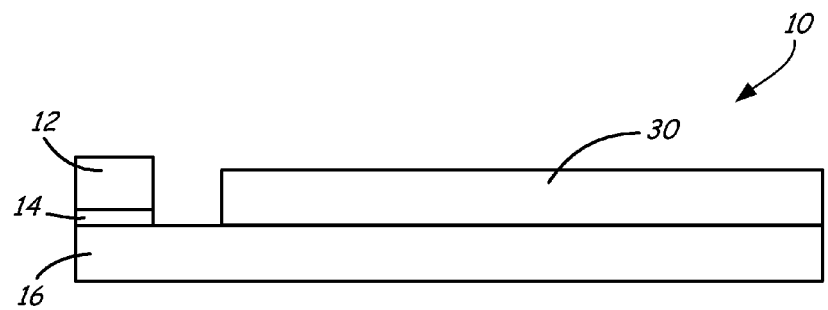
FIG. 7 is a layer diagram of a sixth embodiment of a magnetoresistive stack of the present invention.

FIG. 7 is another embodiment of magnetoresistive stack 10, which includes free layer 12, separating layer 14 and pinned layer 16. In this embodiment of the invention, antiferromagnetic layer 30 has been added to the stack. Antiferromagnetic layer 30 is typically about 4-30 nm thick and made of an antiferromagnetic alloy, such as PtMn, IrMn, NiMn, or FeMn. Antiferromagnetic layer 30 is placed adjacent to the surface of pinned layer 16 that is closest to free layer 12. Antiferromagnetic layer 30 magnetically couples with pinned layer 16, so that the magnetic orientation of pinned layer 16 remains in the desired direction. Antiferromagnetic layer 30 provides added stabilization of the magnetization direction of pinned layer 16.

It is known in the art that antiferromagnetic materials have limited use in magnetoresistive stacks because they corrode easily when exposed to air. Thus, if an antiferromagnetic layer were, like hard magnetic layer 18, added to magnetoresistive stack 10 adjacent to the surface of pinned layer 16 on the side of pinned layer 16 that is furthest from free layer 12, it would be exposed to air and would easily corrode. Placing antiferromagnetic layer 30 adjacent to pinned layer 16 and on the same side as free layer 12 and spacing layer 14 protects antiferromagnetic layer 30 from the air and reduces corrosion.

It will be appreciated by those skilled in the art that the invention can be applied to different types of conventional magnetoresistive stacks. As noted, for example, the invention can be applied to spin valve devices, in which separating layer 14 is a spacer layer, or to tunneling magnetoresistive devices, in which separating layer 14 is a tunneling barrier. Also, the invention can be applied to a magnetoresistive stack in which the free layer has perpendicular anisotropy and the pinned layer has in-plane anisotropy. Similarly, the invention can be applied to any application of a magnetoresistive stack, such as a magnetic read head, magnetic sensor or magnetic random access memory.

Although the present invention has been described with reference to preferred embodiments, workers skilled in the art will recognize that changes may be made in form and detail without departing from the spirit and scope of the invention.

The invention claimed is:

1. A magnetoresistive device comprising:
a free layer having a rotatable magnetic moment;
a pinned layer having a fixed magnetic moment, wherein the pinned layer has a greater cross-sectional dimension than the free layer;
a separating layer positioned between the free layer and the pinned layer; and
a magnetic stabilizer in close proximity to the pinned layer and spaced from a surface of the pinned layer, wherein the magnetic stabilizer induces a magnetic field with a same magnetic orientation as the pinned layer, increasing stability of magnetic orientation of the pinned layer.

2. The magnetoresistive device of claim 1, wherein the magnetic stabilizer comprises a conductor configured to conduct a current to induce the magnetic field.

3. The magnetoresistive device of claim 2, wherein the conductor conducts a DC current to induce the magnetic field with the same magnetic orientation as the pinned layer.

4. The magnetoresistive device of claim 2, wherein the conductor is selected from a group consisting of copper, aluminum and gold.

5. The magnetoresistive device of claim 1, wherein the separating layer comprises a nonmagnetic conductor that spaces the free layer from the pinned layer.

6. The magnetoresistive device of claim 1, wherein the separating layer comprises an insulating barrier that enables electron tunneling between the free layer and the pinned layer.

7. The magnetoresistive device of claim 1, wherein the pinned layer has in-plane anisotropy.

8. The magnetoresistive device of claim 1, wherein the separating layer is in contact with the free layer.

9. The magnetoresistive device of claim 1, wherein the separating layer is in contact with the pinned layer.

10. The magnetoresistive device of claim 1, wherein the pinned layer has a greater lateral dimension than the pinned layer.

11. A magnetoresistive device comprising:
a free layer having a rotatable magnetic moment;
a pinned layer having a fixed magnetic moment, wherein the pinned layer has a greater cross-sectional dimension than the free layer and a greater lateral dimension than the free layer;
a separating layer positioned between the free layer and the pinned layer; and
a conductor in close proximity to the pinned layer and spaced from a surface of the pinned layer, wherein the conductor is configured to conduct electrical current to induce a magnetic field with a same magnetic orientation as the pinned layer, wherein the conductor is configured to increase stability of magnetic orientation of the pinned layer.

12. The magnetoresistive device of claim 11, wherein the conductor comprises a first conductor and further comprising a second conductor spaced from the surface of the pinned layer on a side farthest from the first conductor.

13. The magnetoresistive device of claim 12, wherein the second conductor is configured to conduct current in an opposite direction from the first conductor to induce a magnetic field with the same magnetic orientation as the pinned layer.

14. The magnetoresistive device of claim 11, wherein the magnetoresistive device is configured to be used as a magnetoresistive random access memory element.

15. The magnetoresistive device of claim 11, wherein the magnetoresistive device is configured to be used as a magnetic tunneling transistor element.

16. The magnetoresistive device of claim 11, wherein the magnetoresistive device is configured to be used as a magnetic sensor element.

17. A magnetic memory element comprising:
a free layer having a rotatable magnetic moment;
a pinned layer having a fixed magnetic moment, wherein the pinned layer has a greater cross-sectional dimension than the free layer and a greater lateral dimension than the free layer;
a separating layer positioned between and in contact with the free layer and the pinned layer; and
a magnetic stabilizer comprising a conductor located in close proximity to the pinned layer and spaced from a surface of the pinned layer, wherein the conductor induces a magnetic field with a same magnetic orientation as the pinned layer, increasing stability of magnetic orientation of the pinned layer.

18. The magnetic memory element of claim 17, wherein the conductor is spaced from the surface of the pinned layer on a side farthest from the free layer.

19. The magnetic memory element of claim 17, wherein the conductor layer is spaced from the surface of the pinned layer on a side farthest from the pinned layer.

20. The magnetic memory element of claim 17, wherein the conductor conducts a DC current to induce the magnetic field in the same magnetic orientation as the pinned layer.

* * * * *